(12) United States Patent
Yamamoto

(10) Patent No.: US 8,552,637 B2
(45) Date of Patent: Oct. 8, 2013

(54) ORGANIC ELECTROLUMINESCENCE ELEMENT HAVING A CONDUCTIVE RESIN LAYER AND METHOD FOR MANUFACTURING THE SAME

(75) Inventor: Kyoko Yamamoto, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 13/387,527

(22) PCT Filed: Jul. 26, 2010

(86) PCT No.: PCT/JP2010/062521
§ 371 (c)(1),
(2), (4) Date: Jan. 27, 2012

(87) PCT Pub. No.: WO2011/013618
PCT Pub. Date: Feb. 3, 2011

(65) Prior Publication Data
US 2012/0119643 A1 May 17, 2012

(30) Foreign Application Priority Data

Jul. 30, 2009 (JP) ................................. 2009-177665

(51) Int. Cl.
*H01J 1/62* (2006.01)
*H01J 63/04* (2006.01)
*H01J 17/49* (2012.01)

(52) U.S. Cl.
USPC ........... 313/504; 313/483; 313/500; 313/501; 313/502; 313/503; 313/505; 313/506; 445/24; 445/25; 445/1

(58) Field of Classification Search
None
See application file for complete search history.

(56) References Cited

U.S. PATENT DOCUMENTS

| 7,868,351 | B2 * | 1/2011 | Taniguchi et al. | 257/103 |
| 8,049,333 | B2 * | 11/2011 | Alden et al. | 257/741 |
| 8,094,247 | B2 * | 1/2012 | Allemand et al. | 349/12 |
| 2005/0221083 | A1 | 10/2005 | Belcher et al. | |
| 2006/0292362 | A1 | 12/2006 | Hsu et al. | |

(Continued)

FOREIGN PATENT DOCUMENTS

| JP | 2004-228057 A | 8/2004 |
| JP | 2006-171336 A | 6/2006 |

(Continued)

OTHER PUBLICATIONS

Machine translation of WO 2010/082428 (Takeda et al).*

(Continued)

*Primary Examiner* — Natalie Walford
(74) *Attorney, Agent, or Firm* — Sughrue Mion, PLLC

(57) ABSTRACT

Provided is a an organic electroluminescence element comprising: a transparent plate with an electrode attached, which comprises a transparent-plate body that exhibits light-transmissivity, and a first electrode that is installed on the transparent-plate body; a second electrode arranged in opposition to the first electrode, and which has a different polarity from the first electrode; and a light-emitting layer installed in between the first electrode and the second electrode. The first electrode, comprising a mixed layer having a conductive first resin and a multitude of wire-formed conductors, and a conductive-resin layer having conductive resin and not having any wire-formed conductors, consists of being laminated on the transparent-plate body, with the mixed layer arranged at the transparent-plate body side.

13 Claims, 1 Drawing Sheet

(56) References Cited

U.S. PATENT DOCUMENTS

| | | | |
|---|---|---|---|
| 2007/0074316 A1 | 3/2007 | Alden et al. | |
| 2008/0143906 A1 | 6/2008 | Allemand et al. | |
| 2009/0117327 A1 | 5/2009 | Takada | |
| 2010/0277887 A1* | 11/2010 | Su et al. | 362/19 |
| 2012/0171574 A1* | 7/2012 | Zhamu et al. | 429/300 |

FOREIGN PATENT DOCUMENTS

| | | | |
|---|---|---|---|
| JP | 2009-505358 A | 2/2009 | |
| JP | 2009-129882 A | 6/2009 | |
| WO | 2007002737 A2 | 1/2007 | |
| WO | 2008046058 A2 | 4/2008 | |
| WO | 2009060717 A1 | 5/2009 | |
| WO | WO 2010/082428 A1 | 7/2010 | |
| WO | WO 2010082428 A1 * | 7/2010 | |

OTHER PUBLICATIONS

C. Ducamp-Sanguesa, et al., "Synthesis and Characterization of Fine and Monodisperse Silver Particles of Uniform Shape", Journal of Solid State Chemistry, 1992, pp. 272-280, vol. 100.

Nikhil R. Jana, et al., "Wet chemical synthesis of silver nanorods and nanowires of controllable aspect ratio", Chem. Commun., 2001, pp. 617-618.

Supplementary European Search Report issued in corresponding EP Application No. 10804364.7, dated Jul. 16, 2013.

Japanese Office Action issued on Jun. 27, 2013 in corresponding JP Application No. 2009-177665.

English translation of Japanese Office Action dated Jun. 27, 2013 issued in corresponding JP Application No. 2009-177665.

* cited by examiner

ORGANIC ELECTROLUMINESCENCE ELEMENT HAVING A CONDUCTIVE RESIN LAYER AND METHOD FOR MANUFACTURING THE SAME

CROSS REFERENCE TO RELATED APPLICATIONS

This application is a National Stage of International Application No. PCT/JP2010/062521 filed Jul. 26, 2010, claiming priority based on Japanese Patent Application No. 2009-177665, filed Jul. 30, 2009, the contents of all of which are incorporated herein by reference in their entirety.

TECHNICAL FIELD

The present invention relates to an organic electroluminescence device and a process for producing the same.

BACKGROUND ART

An organic electroluminescence device (hereinafter also abbreviated as an organic EL device) is constituted by a pair of electrodes and a light-emitting layer situated therebetween. When a voltage is applied between the electrodes, a light is emitted from a light-emitting layer and the light goes out passing through the light-transmissive electrode of the pair of electrodes. For such a light-transmissive electrode, for example, a network-structured conductor composed of a conductive material having an irregular network structure (see e.g., Patent Literature 1) is used.

CITATION LIST

Patent Literature

Patent Literature 1: JP 2004-228057 A

SUMMARY OF INVENTION

Technical Problem

However, the conventional network-structured conductors have poor surface smoothness, and when they are used for the manufacture of an organic EL device, a leakage current may occur, failing to provide an organic EL device having a high luminous efficacy.

Thus, an object of the present invention is to provide an organic EL device with suppressed occurrence of leakage current and having a high luminous efficacy.

Solution to Problem

The present invention relates to an organic electroluminescence device comprising
an electrode-coated transparent substrate comprising a light-transmissive transparent plate and a light-transmissive first electrode provided thereon,
a second electrode positioned as opposed to the first electrode and having a polarity different from the first electrode, and
a light-emitting layer provided between the first electrode and the second electrode, wherein
the first electrode comprises
a mixture layer containing a conductive first resin and a large number of wire-like conductors, and
a conductive resin layer containing a conductive resin and no wire-like conductors, and
the first electrode comprises the mixture layer positioned on the side of the transparent plate and laminated on the transparent plate.

The present invention relates to an organic electroluminescence device, wherein the first resin contained in the mixture layer is a resin having the same composition as the conductive resin contained in the conductive resin layer.

The present invention relates to an organic electroluminescence device, wherein the first resin contained in the mixture layer and the resin contained in the conductive resin layer are integrally formed.

The present invention relates to an organic electroluminescence device, wherein the mixture layer further contains at a position contacting the transparent plate a second resin having a higher adhesion to the transparent plate than the first resin.

The present invention relates to an organic electroluminescence device, wherein the first electrode has a surface roughness of 10 nm or less.

The present invention relates to an organic electroluminescence device, wherein the large number of wire-like conductors in the mixture layer form a network structure.

The present invention relates to an organic electroluminescence device, wherein the wire-like conductor has a diameter of 200 nm or less.

The present invention relates to an organic electroluminescence device, wherein, with $n1$ being a refractive index of the first electrode and $n2$ being a refractive index of the transparent plate, $n1$ and $n2$ meet the following formulae:

$$|n2-n1|<0.3$$

$$n1 \leq 1.8,$$

respectively.

The present invention relates to an organic electroluminescence device, wherein the first electrode is an anode.

The present invention relates to a lighting device, which uses the above-mentioned organic electroluminescence device.

The present invention relates to a process for producing an organic electroluminescence device comprising the steps of
preparing a transparent plate,
forming a conductive wire layer by coating the transparent plate with a dispersion containing a large number of wire-like conductors dispersed in a dispersion medium and further removing the dispersion medium,
forming a mixture layer comprising the large number of wire-like conductors and a conductive resin mixed together and a conductive resin layer integrally formed on the mixture layer, by coating the conductive wire layer with a coating solution containing the conductive resin and drying the coating solution and,
forming a light-emitting layer on the conductive resin layer, and
forming an electrode on the light-emitting layer.

The present invention relates to a process for producing an organic electroluminescence device further comprising, after the step of forming a conductive wire layer and before coating the conductive wire layer with a coating solution containing the conductive resin, a step of forming a resin layer having a lower height from the transparent plate than the conductive wire layer by coating the conductive wire layer with a coating solution containing a second resin having a higher adhesion to the transparent plate than the conductive resin and further drying the coating solution.

The present invention relates to a process for producing an organic electroluminescence device, wherein the conductive wire layer is pattern formed in the step of forming a conductive wire layer.

Advantageous Effects of Invention

The present invention can realize an organic electroluminescence device with reduced occurrence of the leakage current and having a high luminous efficacy.

DESCRIPTION OF EMBODIMENTS

Figure 1:
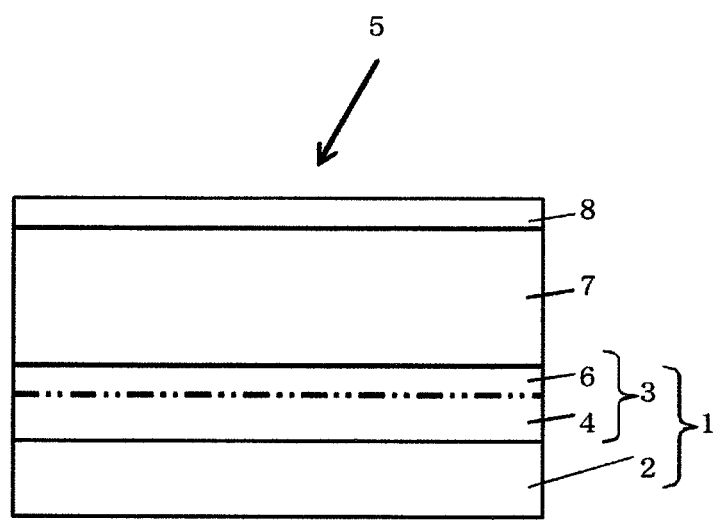
FIG. 1 is a sectional view showing an organic LE device.
Figure 2:
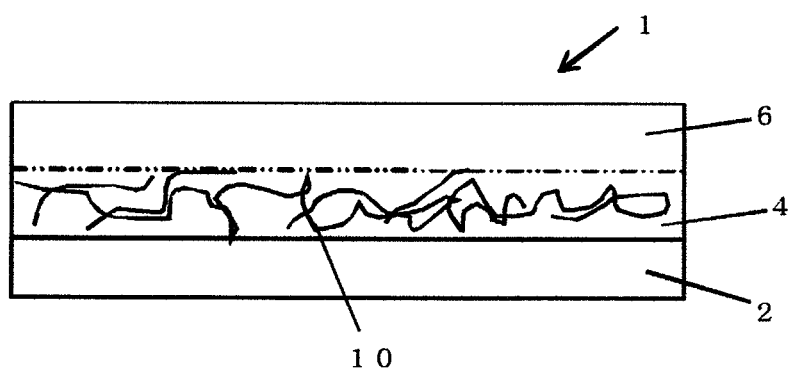
FIG. 2 is a view showing only an electrode-coated transparent substrate provided with a light-transmissive first electrode on a light-transmissive transparent plate.

FIG. 1 is a sectional view showing the organic EL device according to an embodiment of the present invention. FIG. 2 is a view showing only an electrode-coated transparent substrate provided with a light-transmissive first electrode on a light-transmissive transparent plate.

Using the electrode-coated transparent substrate shown in FIG. 2, an organic EL device with reduced occurrence of the leakage current and a high luminous efficacy can be obtained. The organic EL device according to the present embodiment is used for, for example, displays such as monochrome display device, full color display device, area electrochromatic display device, as well as lighting devices, and particularly desirably used for lighting devices.

The organic EL device 5 of the present embodiment comprises an electrode-coated transparent substrate provided with a light-transmissive first electrode on a light-transmissive transparent plate, a second electrode having a different polarity from the first electrode, and a light-emitting layer situated between the first and the second electrodes.

The light-emitting layer is inevitably provided between the first electrode 3 and the second electrode 8, but other predetermined layers are also provided as necessary in addition to the light-emitting layer. The member sandwiched between the first electrode 3 and the second electrode 8 is hereinafter described as an organic layer 7. More specifically, the organic layer 7 may be provided with at least one light-emitting layer, may be composed of a laminate wherein one or more layers are provided between the light-emitting layer and the second electrode 8 and/or between the light-emitting layer and the first electrode 3, or may be composed of a single light-emitting layer. The organic layer 7 may further be provided with an inorganic layer comprising an inorganic compound. For example, an inorganic layer may also be disposed at a position contacting the first electrode 3 of the organic layer 7 as to be described later.

The organic EL device 5 of the present embodiment is a bottom emitting device which allows the light emitted from the light-emitting layer to pass through the electrode-coated transparent substrate 1 and to go out. Further, either one of the first electrode 3 or the second electrode 8 is the anode and the other one is the cathode, but the first electrode 3 is preferably the anode in the present embodiment. The second electrode having the different polarity from the first electrode 3 is provided as the cathode in such a case.

When the second electrode is provided as a cathode, the cathode material is preferably those having a small work function, easiness of electron injection into the light-emitting layer and a high electrical conductivity. Alternatively, when light is taken out from the anode side, the cathode material is preferably those having a high visible light reflectance to reflect the light at the cathode.

The cathode material can include metals such as alkali metal, alkaline earth metal, transition metals and the Group XIII metals of the Periodic Table. Specific examples of the cathode material used include metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium; or alloys of two or more of the above metals; or alloys of one or more thereof and one or more of gold, silver, platinum, copper, manganese, titanium, cobalt, nickel, tungsten and tin; or graphite or graphite intercalation compounds. Examples of the alloy include magnesium-silver alloy, magnesium-indium alloy, magnesium-aluminum alloy, indium-silver alloy, lithium-aluminum alloy, lithium-magnesium alloy, lithium-indium alloy, potassium-aluminum alloy. Alternatively, a transparent conductive electrode can be used as the cathode, and, for example, thin films of conductive metal oxides, conductive organic materials, etc., are usable. Specifically, thin film of indium oxide, zinc oxide, tin oxide, indium tin oxide (abbreviated name ITO), indium zinc oxide (abbreviated name IZO), or the like as the conductive metal oxide, or polyaniline or derivatives thereof, polythiophene or derivatives thereof, and like an organic first electrode as the conductive organic material may be used. The cathode may be in a laminate structure of two or more layers. An electron injection layer to be described later may also be used as the cathode.

When the second electrode is provided as the cathode, a thin film of, e.g., aluminium, gold or silver, or a laminate of such a thin film and ITO may be used as the second electrode.

The film thickness of the second electrode can be suitably selected considering the electrical conductivity and durability, and is, for example, 10 nm to 10 μm, preferably 20 nm to 1 μm, more preferably 50 nm to 500 nm.

Examples of the production method of the second electrode include vacuum deposition process, sputtering method, laminating method wherein a metal thin film is compressed with heat, or the like.

Hereinafter, the electrode-coated transparent substrate used in the present invention is described.

As shown in FIG. 2, the electrode-coated transparent substrate 1 is constituted by a transparent plate 2 and the first electrode 3 formed on the surface of the transparent plate 2. The first electrode 3 contains a conductive resin and a large number of wire-like conductors 10.

The first electrode 3 comprises a laminate of a mixture layer 4 containing the conductive first resin and a large number of wire-like conductors and a conductive resin layer 6 containing a conductive resin with no wire-like conductors, with the mixture layer 4 being situated on the side of the transparent plate 2.

The first resin contained in the mixture layer 4 and the conductive resin contained in the conductive resin layer 6 do not necessarily have the same composition, or the first resin contained in the mixture layer and the resin contained in the conductive resin layer are not necessarily formed integrally, however, in views of the easy production and resistance uniformity of the electrode-coated transparent substrate, it is desirable that the first resin contained in the mixture layer 4 have the same composition as the conductive resin contained in the conductive resin layer and further the first resin contained in the mixture layer 4 be integrally formed with the resin contained in the conductive resin layer. Thus, when the resin contained in the mixture layer 4 and the resin contained in the conductive resin layer are formed integrally, an interface does not substantially exist between the conductive resin layer 6 and the mixture layer 4, and the conductive resin layer 6 and the mixture layer 4 are integrally formed. In FIGS. 1 and 2, the boundary between the conductive resin layer 6 and the mixture layer 4 is schematically shown with a two-dot chain line.

Preferably used materials for the wire-like conductor 10 include, metals having a low electric resistance, for example, Ag, Au, Cu, Al and alloys thereof. Examples also include the nanowires disclosed in US2005/0221083, US2007/0074316 and US2008/0143906.

The wire-like conductor 10 preferably has a small diameter (generally, shorter axis average length), and those having a diameter of, e.g., 400 nm or less are used, with those having a diameter of 200 nm or less being preferable, 100 nm or less being more preferable. The length (generally, longer axis average length) of the wire-like conductor is, for example, 1 µm or more, preferably 2 µm or more, more preferably 5 µm or more.

The diameter and length of the wire-like conductor are measurable by an SEM observation.

The shapes of the wire-like conductor 10 include a curved or acicular shape. The wire-like conductor 10 allows the light passing through the first electrode 3 to diffract or diffuse and thus increases a haze value of the first electrode 3 and reduces the light transmittance, however, the use of the wire-like conductor with a diameter having about the same size as the wavelength of visible lights or smaller than the wavelength of visible lights enables the first electrode 3 to have a reduced haze value and an enhanced light transmittance of visible lights. When a diameter of the wire-like conductors 10 is too small, the electric resistance is likely to be too high, and hence the diameter is preferably 5 nm or more, more preferably 7 nm or more, further preferably 10 nm or more. When the organic EL device is used, for example, for a lighting device, the first electrode 3 having a somewhat higher haze value can also be imparted together with diffusion function. Since there are thus some devices with which the first electrode 3 having a high haze value is suitably used, the optical properties of the first electrode 3 are selected as necessary in accordance with the device used.

The large number of wire-like conductors 10 preferably forms a network structure in the mixture layer 4. For example, the large number of wire-like conductors 10 form a network structure by being arranged to intertwine with each other in a complicated manner in the mixture layer 4. More specifically, the structure wherein a large number of wire-like conductors are arranged in contact with each other spreads two dimensionally or three dimensionally, thereby forming a network structure. Owing to the wire-like conductors thus forming such a network structure, the volume resistivity of the first electrode 3 can be reduced. The wire-like conductors 10 may be, for example, curved or acicular shaped, and the curved and/or acicular conductors, contacting with each other forming a network structure, is capable of achieving the first electrode 3 with a low volume resistivity.

Examples of the conductive resin (e.g., the conductive first resin) include polyaniline, polythiophene derivatives, and those that do not melt or corrode the wire-like conductors when forming the mixture layer 4 with the large number of wire-like conductors 10 are preferable, and those having a high light transmittance are even more preferable. To improve the conductivity, various additives may be added. The kind of additives is suitably selected according to the properties such as refractive index, and light transmittance of the first electrode 3. Further, when the organic layer 7 is formed on the first electrode 3 by a coating method, it is desirable to compose the first electrode 3 using a member insoluble in a coating solution.

The first electrode 3 contains a large number of wire-like conductors 10 and a conductive resin. The conductive resin having a high light transmittance of visible light range is preferably used. The use of the conductive resin, in addition to such a wire-like conductor 10, thus enables the electric resistance of the first electrode 3 to reduce. Using such a first electrode 3, the voltage drop at the electrode can be suppressed and the organic EL device can be operated at a low voltage, achieving the electric power conservation. The film thickness of the first electrode 3 is suitably selected considering electric resistance and visible light transmittance, and is, for example, 0.03 µm to 10 µm, preferably 0.05 µm to 1 µm.

The film thickness of the conductive resin layer 6 requires the minimum film thickness so that the surface flatness is ensured, and is, for example, 0.01 µm to 0.5 µm, preferably 0.02 µm to 0.3 µm. When the film thickness is larger than 0.5 µm, the electric resistance is likely to be high, whereas when the film is smaller than 0.01 µm, a sufficient surface flatness is less likely to be obtained.

The surface flatness of the first electrode 3 is essential in the respect of avoiding the leakage current in the organic EL device, and the surface roughness is preferably 50 nm or less, more preferably 30 nm or less, and further preferably 10 nm or less.

In the present specification, the surface roughness means the surface average roughness Ra and is equivalent to the arithmetic average roughness described in Item 4.2.1 in JIS B 0601 (amended on Jan. 20, 2001) published by Japanese Standards Association, and determined based on average inclination of the surface profile curve. The surface roughness Ra can be measured using a commercial device.

The mixture layer 4 preferably further contains the second resin having a higher adhesion to the transparent plate 2 than the first resin at the position contacting the transparent plate 2. For example, the mixture layer 4 is preferably composed of a laminate of the first layer wherein the second resin having a high adhesion to the transparent plate 2 and the wire-like conductors are mixed and the second layer wherein the first resin and the wire-like conductors are mixed. The thus formed first layer can enhance the adhesion between the first electrode 3 and the transparent plate 2, thereby improving the electrode reliability.

The second resin may be those electrically conductive or insulated, but preferably those having a high adhesion to the transparent plate 2. Further, the second resin preferably has high transmittance and is insoluble in a coating solution containing a conductive resin when forming the conductive resin layer 6. Furthermore, the second resin is preferably insoluble in a coating solution when forming the organic layer 7 on the first electrode 3 by a coating method. Specific examples include polyolefin resins such as lower density or high density polyethylene, ethylene-propylene copolymer, ethylene-butene copolymer, ethylene-hexene copolymer, ethylene-octene copolymer, ethylene-norbornene copolymer, ethylene-dimethano-octahydronaphthalene copolymer, polypropylene, ethylene-vinyl acetate copolymer, ethylene-methyl methacrylate copolymer, and ionomer resin; polyester resins such as polyethylene terephthalate, polybutylene terephthalate, and polyethylene naphthalate; nylon-6, nylon-6,6, metaxylenediamine-adipic acid condensation polymerization; amide resins such as polymethyl methacrylimide; acrylic resins such as polymethyl methacrylate; styrene-acrylonitrile resins such as polystyrene, styrene-acrylonitrile copolymer, styrene-acrylonitrile-butadiene copolymer, and polyacrylonitrile; hydrophobic cellulose resins such as cellulose triacetate and cellulose diacetate; halogen-containing resins such as polyvinyl chloride, polyvinylidene chloride, polyvinylidene fluoride, and polytetrafluoroethylene; hydrogen-binding resins such as polyvinyl alcohol, ethylene-vinylalcohol copolymer, and cellulose derivative; engineering plastic resins such as polycarbonate resins, polysulfone resins, polyether sulfone resins, polyether ether keton resins, polyphenylene oxide resins, polymethylene oxide resins, polyarylate resins, and liquid crystal resins. Thermosetting resins, light curable resins, photoresist materials are desirably used.

The electrode-coated transparent substrate 1 has the organic layer 7 provided in contact therewith. This organic layer 7 is provided at least with a single light-emitting layer. With n1 being a refractive index of the first electrode 3 and n2 being a refractive index of the transparent plate 2, it is preferable that n1 and n2 meet the following formulae:

$$|n2-n1|<0.3$$

$$n1 \leq 1.8,$$

respectively.

The refractive index n1 has the absolute lower limit of 1.0, but is typically 1.2 or higher. Further, with the surface refractive index on the first electrode 3 side of the organic layer 7 being n3, the refractive index (n1) of the first electrode 3 is preferably n3 or less (n1≤n3).

Particularly, when |n1−n2|≥0.3 is met, the total reflection is likely to take place at the boundary between the first electrode 3 and the transparent plate 2, however, the total reflection can be suppressed by adjusting the absolute value of the refractive index difference between the first electrode 3 and the transparent plate 2 to be below 0.3, allowing the light emitted from the light-emitting layer to go out effectively.

When the first electrode 3 is used as the anode, the part of the layer contacting the first electrode 3 of the organic layer 7 can be, for example, a hole injection layer, a hole transport layer, a light-emitting layer described below. The refractive index of the hole injection layer, the hole transport layer and the light-emitting layer is typically about 1.5 to about 1.8. The refractive index (n1) of the first electrode 3 is preferably determined so that it is equal to or less than the refractive index (n3) of the layer contacting the first electrode 3.

Preferably used transparent plate 2 has a high light transmittance of visible light range and is free of chemical reactions in the step of forming a device thereon and may be a rigid substrate or flexible substrate including, for example, glass plates, plastic plates, polymer films and silicon plates as well as laminates wherein these plates and films are laminated.

The face opposite to the face, on which the first electrode 3 is formed, of the transparent plate 2 may have asperities having elevation differences of 0.1 μm or more and 0.2 mm or less. For the asperity, for example, it is preferable to form the asperities having elevation differences of 0.1 μm or more and 0.2 mm or less. Owing to the formation of such asperities, the total reflection occurred at the interface between the substrate and air can be suppressed. Alternatively, instead of forming the asperities directly on the transparent plate 2, a film with the asperities formed on the surface may be attached to the transparent plate 2. For example, when a film is attached using a predetermined adhesive layer interposed therebetween, it is desirable that the absolute value of the difference of the refractive indexes of the adhesive layer and two members sandwiching the adhesive layer be 0.2 or less. Using such an adhesive layer and film, the light reflex at the film and adhesive layer can be suppressed.

The transparent plate 2 is preferably a substrate impervious to oxygen and steam (having barrier properties). To enhance the barrier properties of the transparent plate 2, the transparent plate 2 may have the surface provided with an inorganic layer comprising metals, metal oxides, metal nitrides, metal carbides or metal nitride oxides, etc., a laminated layer of an inorganic layer and an organic layer, or an inorganic-organic hybrid layer, etc. The inorganic layer is preferably stable in the air, and specific examples include thin film layers of silica, alumina, titania, indium oxide, tin oxide, titanium oxide, zinc oxide, indium tin oxide, aluminium nitride, silicon nitride, silicon carbide or silicon oxynitride and combinations thereof. Thin film layers comprising aluminium nitride, silicon nitride and silicon oxynitride are more preferable, with a thin film layer of silicon oxynitride being further preferable. Suitably usable thin film layers among those described as examples are those having a refractive index difference of below 0.3 with respect to that of the first electrode 3.

The organic layer 7 is described next. The organic layer 7 is situated between the first electrode 3 provided as either one of the cathode or anode electrode and the other electrode provided as the other cathode or anode electrode, and provided with at least a single light-emitting layer.

Examples of the layer situated between the cathode and the light-emitting layer include an electron injection layer, an electron transport layer, a hole-blocking layer. When both an electron injection layer and an electron transport layer are provided between the cathode and the light-emitting layer, the layer positioned closer to the cathode is termed the electron injection layer and the layer positioned closer to the light-emitting layer is termed the electron transport layer.

The electron injection layer is a layer serving to improve the electron injection efficiency from the cathode. The electron transport layer is a layer serving to improve the electron injection from the cathode or electronic injection layer, or the electron transport layer closer to the cathode. The hole-blocking layer is a layer serving to interrupt the hole transportation. The electron injection layer or the electron transport layer may sometimes serve as the hole-blocking layer.

Examples of the layer provided between the anode and the light-emitting layer include hole injection layer, hole transport layer, electron blocking layer. When both a hole injection layer and a hole transport layer are provided between the anode and the light-emitting layer, the layer positioned closer to the anode is termed the hole injection layer and the layer positioned closed to the light-emitting layer is termed the hole transport layer.

The hole injection layer is a layer serving to improve the hole injection efficiency from the anode. The hole transport layer is a layer serving to improve the hole injection from the anode or hole injection layer, or the hole transport layer closer to the anode. The electron blocking layer is a layer serving to interrupt the electron transportation. The hole injection layer or the hole transport layer may sometimes serve as the electron blocking layer.

The electron injection layer and the hole injection layer may sometimes be referred collectively to as the charge injection layer, and the electron transport layer and the hole transport layer may sometimes be referred collectively to as the charge transport layer.

Specific examples of the layer structure applicable to the organic EL device are shown below.
a) Anode/hole transport layer/light-emitting layer/cathode
b) Anode/light-emitting layer/electron transport layer/cathode c) Anode/hole transport layer/light-emitting layer/electron transport layer/cathode
d) Anode/charge injection layer/light-emitting layer/cathode
e) Anode/light-emitting layer/charge injection layer/cathode
f) Anode/charge injection layer/light-emitting layer/charge injection layer/cathode
g) Anode/charge injection layer/hole transport layer/light-emitting layer/cathode
h) Anode/hole transport layer/light-emitting layer/charge injection layer/cathode
i) Anode/charge injection layer/hole transport layer/light-emitting layer/charge injection layer/cathode
j) Anode/charge injection layer/light-emitting layer/charge transport layer/cathode
k) Anode/light-emitting layer/electron transport layer/charge injection layer/cathode
l) Anode/charge injection layer/light-emitting layer/electron transport layer/charge injection layer/cathode
m) Anode/charge injection layer/hole transport layer/light-emitting layer/charge transport layer/cathode
n) Anode/hole transport layer/light-emitting layer/electron transport layer/charge injection layer/cathode
o) Anode/charge injection layer/hole transport layer/light-emitting layer/electron transport layer/charge injection layer/cathode
(Here, the sign "/" means that two layers sandwiching the sing "/" are adjacent to and laminated against each other. The same shall apply hereinafter.)

The organic EL device of the present embodiment may have two or more light-emitting layers. Specific examples of the organic EL device having two or more light-emitting layers include those having the layer structure of
p) anode/charge injection layer/hole transport layer/light-emitting layer/electron transport layer/charge injection layer/electrode/charge injection layer/hole transport layer/light-emitting layer/electron transport layer/charge injection layer/cathode.

Further, examples of the organic EL device having three or more light-emitting layers include, with (electrode/charge injection layer/hole transport layer/light-emitting layer/electron transport layer/charge injection layer) being one repeating unit, those having a layer structure containing two or more repeating units such as q) anode/charge injection layer/hole transport layer/light-emitting layer/electron transport layer/charge injection layer/repeating unit/repeating unit/ . . . /cathode.

In the above layer structures p and q, each layer other than anode, electrode, cathode, light-emitting layer can be cancelled as necessary.

The organic EL device may be provided with an insulating layer having a film thickness of 2 nm or less adjacent to the electrode to further improve the adhesion to the electrode and the charge injection from the electrode, and may be provided with a thin buffer layer inserted to the interface between the adjacent each layer described above for the interface adhesion improvement and mixture prevention, etc.

Hereinafter, the specific structure of each layer is described.

<Hole Injection Layer>

Examples of the hole injection material composing the hole injection layer include phenylamine, starburst amine, phthalocyanine, oxides such as vanadium oxide, molybdenum oxide, ruthenium oxide, and aluminum oxide, amorphous carbon, polyaniline, polythiophene derivatives. When the conductive resin composing the first electrode 3 serves also as the hole injection layer, the hole injection layer can be omitted.

<Hole Transport Layer>

Examples of the hole transport material composing the hole transport layer include polyvinyl carbazole or derivatives thereof, polysilane or derivatives thereof, polysiloxane derivatives having aromatic amine in the side chain or the main chain, pyrazoline derivatives, arylamine derivatives, stilbene derivatives, triphenyldiamine derivatives, polyaniline or derivatives thereof polythiophene or derivatives thereof, polyarylamine or derivatives thereof, polypyrrole or derivatives thereof, poly(p-phenylenevinylene) or derivatives thereof, or poly(2,5-thienylenevinylene) or derivatives thereof.

Among these hole transport materials, polymer hole transport materials such as polyvinyl carbazole or derivatives thereof, polysilane or derivatives thereof, polysiloxane derivatives having an aromatic amine compound group in the side chain or the main chain, polyaniline or derivatives thereof, polythiophene or derivatives thereof, polyarylamine or derivatives thereof, poly(p-phenylenevinylene) or derivatives thereof, or poly(2,5-thienylenevinylene) or derivatives thereof are preferable, with polyvinyl carbazole or derivatives thereof, polysilane or derivatives thereof, polysiloxane derivatives having aromatic amine in the side chain or the main chain, etc., being further preferable. A low molecular weight hole transport material is preferably dispersed in a polymer binder for use.

An example of the film formation method for the hole transport layer using a low molecular weight hole transport material includes a method in which a film is formed from a solution mixed with a polymer binder, and an example of the film formation method using a high molecular weight hole transport material includes a method in which a film is formed from a solution.

The solvent used for the film formation from a solution can be any solvent insofar as it dissolves a hole transport material and examples can include chlorinated solvents such as chloroform, methylene chloride, and dichloroethane, ether solvents such as tetrahydrofuran, aromatic hydrocarbon solvents such as toluene, xylene, ketone solvents such as acetone and methyl ethyl ketone, and ester solvents such as ethyl acetate, butyl acetate, and ethyl cellosolve acetate.

Examples of the film formation method from a solution can include coating methods such as spin coating method, casting method, micro gravure coating method, gravure coating method, bar coating method, roll coating method, wire bar coating method, DIP coating method, spray coating method, screen printing method, flexo printing method, offset printing method, ink jet printing method.

A suitably used polymer binder to be mixed with is that does not extremely block the electron transport and has a low absorption of visible light. Examples of such polymer binder include polycarbonate, polyacrylate, polymethyl acrylate, polymethyl methacrylate, polystyrene, polyvinyl chloride, polysiloxane, etc.

The optimum value of the film thickness of the hole transport layer varies depending on the material used and is determined so that the driver voltage and luminous efficacy have suitable values. The film thickness must be at least thick enough not to cause pinholes but when it is too thick, a high drive voltage of the device results, hence not preferable. Thus, the film thickness of the hole transport layer is, for example, 1 nm to 1 µm, preferably 2 nm to 500 nm, further preferably 5 nm to 200 nm.

<Light-Emitting Layer>

The light-emitting layer consists of an organic material which emits fluorescence and/or phosphorescence, or such an organic material and dopant. Dopant is added for the purpose of, for example, improving the luminous efficacy and changing luminous wavelength. The organic material used for the light-emitting layer may be either a low molecular weight compound or a high molecular weight compound. Examples of the light-emitting material composing the light-emitting layer include as follows. A high molecular weight compound generally has a higher solubility to the solvent than a low molecular weight compound, and, when the light-emitting layer is formed by a coating method, the light-emitting layer preferably contains a high molecular weight compound because the use of a high molecular weight compound facilitates the process, and the like.

Examples of the dye light-emitting material include cyclopentamine derivatives, tetraphenylbutadiene derivatives, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophen derivatives, oxadiazole dimers, pyrazoline dimers.

Examples of the metallic complex light-emitting material can include those having, as the central metal, Al, Zn, Be, or the like, or rare earth metals such as Tb, Eu, Dy, and having a ligand of the oxadiazole, thiadiazole, phenylpyridine, phenylbenzoimidazole, quinoline structure, or the like, and examples can include metallic complexes which emit light in a triplet excited state such as iridium complex and platinum complex, alumiquinolinol complex, benzoquinolinol beryllium complex, benzoxazolyl zinc complex, benzothiazol zinc complex, azomethyl zinc complex, porphyrin zinc complex, europium complex.

Examples of the high molecular weight light-emitting material include polyparaphenylenevinylene derivatives, polythiophene derivatives, polyparaphenylene derivatives, polysilane derivatives, polyacethylene derivatives, polyfluorene derivatives, and polyvinyl carbazole derivatives, as well as polymerized dye light-emitting materials and metallic complex light-emitting materials described above.

Among the above light-emitting materials, examples of the blue light-emitting material can include distyrylarylene derivatives, oxadiazole derivatives, and polymers thereof polyvinyl carbazole derivatives, polyparaphenylene derivatives, polyfluorene derivatives. Among those, high molecular weight materials such as polyvinyl carbazole derivatives, polyparaphenylene derivatives, polyfluorene derivatives, are preferable.

Examples of the green light-emitting material can include quinacridone derivatives, coumarin derivatives, and polymers thereof, polyparaphenylene vinylene derivatives, polyfluorene derivatives. Among these, high molecular weight materials such as polyparaphenylene vinylene derivatives, polyfluorene derivatives, are preferable.

Further, examples of the red light-emitting material can include coumarin derivatives, thiophene ring compounds, and polymers thereof, polyparaphenylene vinylene derivatives, polythiophene derivatives, polyfluorene derivatives. Among these, high molecular weight materials such as polyparaphenylene vinylene derivatives, polythiophene derivatives, polyfluorene derivatives, are preferable.

For the white light-emitting material, mixtures of each of the blue, green and red light-emitting materials described above may be used or polymers obtained by polymerizing the component for the material emitting each color, as a monomer, may be used. Alternatively, the light-emitting layers formed using each of the color emitting materials may be laminated to realize the device which emits white color as a whole.

Examples of the dopant material can include perylene derivatives, coumarin derivatives, rubrene derivatives, quinacridone derivatives, squarylium derivatives, porphyrin derivatives, styryl dyes, tetracene derivatives, pyrazolone derivatives, decacyclene, phenoxazone. The thickness of these light-emitting layers is typically 2 nm to about 2000 nm.

Examples of the film formation method of the light-emitting layer containing an organic material can include a method wherein a solution containing a light-emitting material is applied to the substrate surface, vacuum deposition process, transfer method. Specific examples of the solvent used for the film formation from a solution can include the same solvents used as the solvent for dissolving a hole transport material when forming a film of the hole transport layer from the solution described above.

The employable method for coating a solution containing a light-emitting material include coating methods such as a spin coating method, a casting method, a micro gravure coating method, a gravure coating method, a bar coating method, a roll coating method, a wire bar coating method, a DIP coating method, a slit coating method, a capillary coating method, a spray coating method, a nozzle coating method, and a gravure printing method, a screen printing method, a flexo printing method, an offset printing method, a reverse printing method, an ink jet printing method. Due to the easy pattern formation and coating in different colors, gravure printing method, screen printing method, flexo printing method, offset printing method, reverse printing method, ink jet printing method, and the like are preferable. When a sublimable low molecular weight compound is used, the vacuum deposition process can be used. Further, the laser transfer method and heat transfer method enable the formation of a light-emitting layer only on an intended region.

<Electron Transport Layer>

Examples of the electron transport material composing the electron transport layer can include oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorene derivatives, diphenyldicyanoethylene or derivatives thereof, diphenoquinone derivatives, metallic complexes of 8-hydroxyquinoline or derivatives thereof, polyquinoline or derivatives thereof, polyquinoxaline or derivatives thereof, polyfluorene or derivatives thereof.

Preferable electron transport materials among these are oxadiazole derivatives, benzoquinone or derivatives thereof, anthraquinone or derivatives thereof, or metallic complexes of 8-hydroxyquinoline or derivatives thereof, polyquinoline or derivatives thereof, polyquinoxaline or derivatives thereof, polyfluorene or derivatives thereof, with 2-(4-biphenylyl)-5-(4-t-butylphenyl)-1,3,4-oxadiazole, benzoquinone, anthraquinone, tris(8-quinolinol) aluminum, polyquinoline being more preferable.

An example of the film formation method for the electron transport layer using a low molecular weight electron transport material includes the vacuum deposition process from powder or a film formation method from a solution or a melted condition, and a film formation method using a high molecular weight electron transport material includes a film formation method from a solution or a melted condition. When a film is formed from a solution or a melted condition, a polymer binder may further be used in combination. An example of the film formation method of the electron transport layer from a solution can include the same film formation method as that of the hole transport layer from the solution described above.

The optimum value of the film thickness of the electron transport layer varies depending on the material used and is determined so that the driver voltage and luminous efficacy have suitable values. The film thickness must be at least thick enough not to cause pinholes but when it is too thick, a high drive voltage of the device results, hence not preferable. Thus, the film thickness of the electron transport layer is, for example, 1 nm to 1 μm, preferably 2 nm to 500 nm, more preferably 5 nm to 200 nm.

<Electron Injection Layer>

Examples of the electron injection material composing the electron injection layer include, depending on the type of the light-emitting layer, alkali metals, alkaline earth metals or alloys containing one or more of the above-mentioned metals, or oxides, halides and carbonates of the above metals, or mixtures of the above products. Examples of the alkali metal or oxide, halide and carbonate thereof include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, lithium carbonate. Examples of the alkali earth metal and oxides, halides and carbonates thereof include magnesium, calcium, barium, strontium, magnesium oxide, magnesium fluoride, calcium oxide, calcium fluoride, barium oxide, barium fluoride, strontium oxide, strontium fluoride, magnesium carbonate. The electron injection layer may be a laminate of two or more layers. Specific examples of the laminate include LiF/Ca. The electron injection layer is formed by vapor depositing process, sputtering method, printing method, etc. The film thickness of the electron injection layer is preferably about 1 nm to about 1 μm.

Next, the process for producing the organic electroluminescence device of the present invention is described. The process for producing the organic electroluminescence device of the present invention comprises the steps of preparing a transparent plate, forming a conductive wire layer by coating the transparent plate with a dispersion containing a large number of wire-like conductors dispersed in a dispersion medium and further removing the dispersion medium, forming a mixture layer containing a large number of wire-like conductors and a conductive resin mixed together, by coating the conductive wire layer with a coating solution containing the conductive resin and drying the coating solution, and a conductive resin layer integrally formed on the mixture layer, forming a light-emitting layer on the conductive resin layer, and forming an electrode on the light-emitting layer.

The step of forming the conductive wire layer by coating the transparent plate 2 with a dispersion containing a large number of wire-like conductors 10 dispersed in a dispersion medium and further removing the dispersion medium is described.

Preferably used examples of the wire-like conductor 10 material include metals having a low electric resistance such as Ag, Au, Cu, Al and alloys thereof. The wire-like conductors 10 can be produced by the method described in, for example, N. R. Jana, L. Gearheart and C. J. Murphy (Chm. Commun., 2001, p. 617-p. 618), the method described in C. Ducamp-Sanguesa, R. Herrera-Urbina, and M. Figlarz et. al (J. Solid State Chem., Vol. 100, 1992, p. 272-p. 280). Examples also include the nanowires described in the patents US2005/0221083, US2007/0074316, US2008/0143906.

The dispersion containing a large number of wire-like conductors 10 dispersed in a dispersion medium is prepared by mixing a large number of wire-like conductors 10 with the dispersion medium. The dispersion medium can be any medium insofar as it does not deteriorate or dissolve the wire-like conductors 10 and is capable of dispersing the wire-like conductors 10 homogeneously, and examples can include water, alcohols such as methanol, ethanol, butanol, and ethylene glycol, chlorinated solvents such as chloroform, methylene chloride, and dichloroethane, ether solvents such as tetrahydrofuran, aromatic hydrocarbon solvents such as toluene and xylene, keton solvents such as acetone and methyl ethyl ketone and ester solvents such as ethyl acetate, butyl acetate, and ethyl cellosolve acetate.

The dispersion containing a large number of wire-like conductors 10 dispersed in a dispersion medium may contain other additives such as surfactants and antioxidants, as necessary. The kind of additives is suitably selected according to the properties such as refractive index, light transmittance, and electric resistance of the first electrode 3.

The concentration of the wire-like conductors 10 in the dispersion may be any concentration as long as the wire-like conductors 10 can be dispersed homogeneously in the dispersion medium, and is preferably 0.01 wt. % to 30 wt. %. When a concentration is lower than 0.01 wt. %, the dispersion must be coated for film formation in an extremely thick film thickness to obtain the first electrode having an intended low electric resistance, hence not realistic, whereas when a concentration is higher than 30 wt. %, the wire-like conductors 10 flocculate, likely failing to achieve homogeneous dispersion.

Examples of the method for coating the dispersion containing a large number of wire-like conductors 10 dispersed to the transparent plate 2 can include industrial methods commonly used such as a dipping method, a coating method using a bar coater, a coating method using a spin coater, a doctor blade method, a spray coating method, a screen printing method, a gravure printing method, a flexo printing method, a reverse printing method, a relief printing method, a brush coating, blasting, and a roll coating.

To apply the dispersion more homogeneously to the transparent plate, the transparent plate 2 may be surface treated before applying the dispersion to the transparent plate. The surface treatment can be any treatment insofar as the dispersion is applied more homogeneously to the transparent plate 2, and examples can include UV ozone treatment, oxygen plasma treatment, corona treatment, and pre-coat treatment of a liquid in which a surfactant is dissolved.

The method for removing the dispersion medium after the dispersion is applied may be any method as long as it does not damage the wire-like conductors, and examples include drying with heating, vacuum drying.

Next, the step of forming a mixture layer 4 containing the conductors and a conductive resin mixed together, by coating the conductive wire layer with a coating solution containing the conductive resin and drying the coating solution and a conductive resin layer 6 integrally formed on the mixture layer 4.

The coating solution containing the conductive resin is prepared by dissolving or dispersing the conductive resin in a solvent. The solvent may be any solvent insofar as it does not deteriorate the conductive resin and is capable of homogenously dissolving or dispersing the conductive resin, and examples can include water, alcohols such as methanol, ethanol, butanol, and ethylene glycol, chlorinated solvents such as chloroform, methylene chloride, and dichloroethane, ether solvents such as tetrahydrofuran, aromatic hydrocarbon solvents such as toluene and xylene, keton solvents such as acetone and methyl ethyl ketone, and ester solvents such as ethyl acetate, butyl acetate, and ethyl cello solve acetate.

The coating solution containing the conductive resin may contain various additives such as surfactants and antioxidants, as necessary. The kind of additives is suitably selected according to the properties such as refractive index, light transmittance, and electric resistance of the first electrode 3.

The concentration of the conductive resin in the coating solution containing the conductive resin may be any concentration as long as the conductive resin is dispersed homogeneously in the solvent, and is preferably 0.5 wt. % to 30 wt. %. When a concentration is lower than 0.5 wt. %, the coating solution must be coated for film formation in an extremely thick film thickness to obtain the first electrode having an intended low electric resistance, hence not realistic, whereas when a concentration is higher than 30 wt. %, the dissolution or the homogeneous dispersion of the conductive resin is likely to be difficult to achieve.

Examples of the method for applying the coating solution containing the conductive resin to the conductive wire layer can include industrial methods commonly used such as a dipping method, a coating method using a bar coater, a coating method using a spin coater, a doctor blade method, a spray coating method, a screen printing method, a gravure printing method, a flexo printing method, a reverse printing method, a relief printing method, brush coating, blasting, and roll coating.

When applying the coating solution containing the conductive resin, the conductive wire layer may be surface treated in advance. The surface treatment can be any treatment as long as it does not damage the conductive wire layer and is capable of homogeneously coating the coating solution containing the conductive resin, and examples include UV ozone treatment, oxygen plasma treatment, corona treatment.

The method for removing the solvent after the coating solution is applied may be any method as long as it does not damage the conductive resin and the conductive wire layer, and examples can include drying with heating, vacuum drying.

The film thickness of the conductive resin layer coated thicker than that of the conductive wire layer when applying the coating solution containing the conductive resin to the conductive wire layer enables the production of the electrode-coated transparent substrate 1, which is a laminate comprising a conductive resin layer 6 containing the conductive resin with no wire-like conductors and a mixture layer 4 wherein a resin having the same composition as the conductive resin and the conductors 10 are mixed in the order of the transparent plate 2, the mixture layer 4 and the conductive resin layer 6, and the first resin having the same composition as that of the conductive resin contained in the conductive resin layer 6 and contained in the mixture layer 4 and the resin contained in the conductive resin layer 6 are integrally formed.

Further, it is preferable to further comprise, after the step of forming the conductive wire layer and before coating the conductive wire layer with the coating solution containing the conductive resin, the step of forming a resin layer having a lower height from the transparent plate 2 than the conductive wire layer by coating the conductive wire layer with a coating solution containing a second resin having a higher adhesion to the transparent plate 2 than the conductive resin and further drying the coating solution.

The step of forming a resin layer having a lower height from the transparent plate 2 than the conductive wire layer by coating the conductive wire layer with a coating solution containing the second resin having a higher adhesion to the transparent plate 2 than the conductive resin and drying the coating solution is further described.

The coating solution containing the second resin having a higher adhesion to the above transparent plate 2 than the conductive resin is prepared by dissolving or dispersing the second resin in the solvent. A liquid monomer at room temperature is used as the coating solution containing the second resin. The solvent can be any solvent insofar as it does not deteriorate the conductive resin and is capable of homogeneously dissolving or dispersing the conductive resin, and examples can include water, alcohols such as methanol, ethanol, butanol, and ethylene glycol, chlorinated solvents such as chloroform, methylene chloride, and dichloroethane, ether solvents such as tetrahydrofuran, aromatic hydrocarbon solvents such as toluene and xylene, keton solvents such as acetone and methyl ethyl ketone, and ester solvents such as ethyl acetate, butyl acetate, and ethyl cellosolve acetate.

The coating solution containing the second resin may contain other additives such as surfactants and antioxidants, as necessary. The kind of additives is suitably selected according to the properties such as refractive index, light transmittance, and electric resistance of the first electrode 3.

The concentration of the second resin in the coating solution containing the second resin may be any concentration as long as the second resin is dispersed homogeneously in a solvent, and is preferably 0.5 wt. % to 30 wt. %. When a concentration is higher than 0.5 wt. %, a large amount of application is required to achieve a layer having an intended film thickness, hence not realistic, whereas when a concentration is higher than 30 wt. %, the dissolution or the homogeneous dispersion of the second resin is likely to be difficult to attain.

Examples of the method for applying the coating solution containing the second resin to the conductive wire layer can include industrially used common methods such as a dipping method, a coating method using a bar coater, a coating method using a spin coater, a doctor blade method, a spray coating method, a screen printing method, a gravure printing method, a flexo printing method, a reverse printing method, a relief printing method, brush coating, blasting, and roll coating.

When applying the coating solution containing the second resin, the conductive wire layer may be surface treated in advance. The surface treatment can be any treatment as long as it does not damage the conductive wire layer and the coating solution containing the second resin is applied homogeneously, and examples include UV ozone treatment, oxygen plasma treatment, corona treatment, or the like.

The method for removing the solvent after the coating solution is applied may be any method as long as it does not damage the second resin and the conductive wire layer, and examples can include drying with heating, vacuum drying.

The second resin having a higher adhesion than the first resin can be formed at a position contacting the transparent plate 2 of the mixture layer 4 containing the conductive wire by forming a film of the second resin thinner than the film thickness of the conductive wire layer when applying the coating solution containing the second resin to the conductive wire layer.

Further, in the step of forming the conductive wire layer, it is preferable to patter form the conductive wire layer. Hereinafter, the step of pattern forming the conductive wire layer is described.

The typical photolithography method can be used for pattern forming the conductive wire layer. In this method, the conductive wire layer can be pattern formed by applying a photoresist onto the conductive wire layer formed by being applied throughout the transparent plate 2 as described above, followed by exposing, developing and further etching the photoresist. In such a case, the conductive wire layer pattern is formed by selectively exposing the formed photoresist film through a photomask, developing to pattern form the photoresist to form on the conductive wire layer the photoresist-masked regions and non photoresist-masked regions and removing the non photoresist-masked regions of the conductive wire layer by etching. Then, the resist material is removed to form the conductive wire layer of the predetermined pattern formed on the transparent plate 2.

Alternatively, the conductive wire layer can be pattern formed by selectively applying the coating solution containing the wire-like conductors in the predetermined pattern. For example, the masking for covering the region where the conductive wire layer is not formed is applied to the transparent plate 2 in advance, the coating solution containing the wire-like conductors is applied throughout the transparent plate 2 through the mask, and the masking is separated therefrom to form the conductive wire layer of the predetermined pattern formed on the transparent plate 2.

Further, alternatively can be employed a method in which selective application of the coating solution just by entirely applying the coating solution is enabled by surface treating the transparent plate 2 prior to the application of the coating solution containing the wire-like conductor to impart water repellent property to the region where the conductive wire layer is not formed.

Furthermore, the conductive wire layer can also be pattern formed by applying the coating solution containing the wire-like conductors in the predetermined pattern using a coating method capable of selectively pattern applying the coating solution. Examples of the coating method capable of selectively pattern applying the coating solution can include industrial methods commonly used such as a screen printing method, a gravure printing method, a flexo printing method, a reverse printing method, a relief printing method, brush coating, and roll coating.

When the conductive resin is coated for formation after pattern forming the conductive wire layer, the conductive resin is applied and formed also to the region where the conductive wire layer is already removed and not present, whereby the conductive wire layer spaces apart by the predetermined pattern is connected by the conductive resin. However, the electric resistances are drastically different between the region containing the wire-like conductors having a highly conductive material such as metals and the conductive resin and the region containing only the conductive resin. More specifically, since the region containing only the conductive resin has a high electric resistance, the electric current does not practically flow in the region consisting solely of the conductive resin, whereby the first electrode is electrically pattern formed as a result.

Next, an organic layer and the second electrode are successively laminated on the first electrode. The organic layer and the second electrode can be successively laminated by the method described earlier.

Thus, since the first electrode 3 can be formed by a coating method as described above, a transparent electrode can be easily formed at a reduced cost in comparison with when a transparent electrode is formed using a vacuum device such as in vacuum deposition and spattering method or when a transparent electrode is formed by a special process. Further, since the properties of the first electrode 3 are determined according to the kind of the resin and wire-like conductor as well as the shape of the wire-like conductor, the first electrode 3 with the intended optical properties and electrical properties can be easily obtained only by suitably selecting these factors.

The organic layer 7 may contain an inorganic layer as described earlier, and for easier hole injection, for example, an inorganic layer contacting the first electrode 3 may be provided by positioning the inorganic layer on the surface of the first electrode 3 side of the organic layer 7. Examples of the inorganic layer can include thin films comprising phenylamine, starburst amine, phthalocyanine, oxides such as vanadium oxide, molybdenum oxide, ruthenium oxide, and aluminum oxide, amorphous carbon, polyaniline, polythiophene derivatives, and the like. The organic EL device may be composed of the first electrode as the cathode and the second electrode as the anode. In the case like this, for easier electron injection, an inorganic layer contacting the first electrode may be provided by positioning the inorganic layer on the surface of the first electrode 3 side of the organic layer 7. Examples of the inorganic layer can include thin films containing alkali metals, alkaline earth metals or alloys containing one or more of the above-mentioned metals, or oxides, halides and carbonates of the above metals, or mixtures of the above products.

The present invention is described hereinbefore considering the bottom emitting type organic EL device, but the present invention is also preferably applicable to the top emitting type organic EL device. For example, the top emitting type organic EL device can be composed by laminating the second electrode, organic layer, first electrode and transparent plate in the order given on a substrate with a drive circuit and the predetermined wiring formed thereon.

EXAMPLES

Hereinafter, the present invention is described in reference to the examples, but is not limited thereto.

The surface roughness Ra of the first electrode is measured using a stylus profiler, KLA Tencor P-16 (registered trademark) (KLA-Tencor Corporation).

Example 1

First, a conductive wire layer was formed on a glass substrate equivalent to the transparent plate. A wire-like conductor dispersion (ClearOhm (registered trademark): product of Cambrios Technologies Corporation) was applied using a spin coater to the glass substrate treated with UV ozone for 5 minutes, the substrate was treated in an oven under the conditions of 50° C. for 90 seconds and subsequently treated with heat on a hot plate under the conditions of 180° C. for 90 seconds to obtain a conductive wire layer having a film thickness of 90 nm. The conductive wire layer formed on unnecessary regions was separated using a cotton swab soaked in water to obtain the conductive wire layer of the predetermined pattern.

Next, a solution obtained by neutralizing a poly(ethylenedioxythiophen)/polystyrene sulfonate (AI4083, product of Starck Ltd.) suspension with ammonia water was applied as a coating solution containing the conductive resin to the conductive wire layer obtained above using a spin coater. The coating solution was placed on the hot plate and heat-treated under the conditions of 200° C. for 20 minutes to form a conductive resin film having a film thickness of 120 nm. The conductive wire layer was impregnated with the conductive resin, and the first electrode, in which the 90 nm film thickness mixture layer wherein the conductive resin and the wire-like conductors are mixed and the 30 nm film thickness conductive resin layer containing no wire-like conductors are integrally formed, is formed on the transparent plate. The first electrode had a surface roughness Ra of 6.5 nm.

Next, a xylene solution containing F8-TFB (a copolymer of 9,9-dioctylfluorene and N-(4-butylphenyl)diphenylamine) in a concentration of 0.7 mass % was prepared. The solution was coated on the above first electrode using a spin coater.

The part of the film formed on the unnecessary region was removed, and the film was further heat-treated on a hot plate at 180° C. for 20 minutes under a nitrogen atmosphere, thereby forming a hole transport layer having a thickness of 15 nm.

Then, a xylene solution containing Lumation WP 1540 (product of SUMATION), a white light-emitting material, in a concentration of 1.2 mass % was prepared. The solution was coated on the hole transport layer using a spin coater. The part of the film formed on the unnecessary region was removed, and the film was further heat-treated on a hot plate at 130° C. for 60 minutes under a nitrogen atmosphere, thereby forming a light-emitting layer having a thickness of 65 nm.

The substrate with the light-emitting layer formed thereon was then introduced into a vacuum deposition device, and Ba and Al were successively vapor deposited to a thickness of 5 nm and 100 nm, respectively, to form the cathode. The metal vapor deposition was started after the degree of vacuum reached $2.5 \times 10^{-4}$ Pa or lower.

Next, a light curable sealant was applied around a sealing glass using a dispenser, the substrate on which the organic EL device was formed and the sealing glass were attached under a nitrogen atmosphere, further followed by curing the light curable sealant using ultraviolet rays to complete the sealing, thereby producing an organic EL device.

EL Property Evaluation

The produced device was energized for the voltage-current property evaluation. The current density at an applied voltage of 5V was 0.056 mA/cm$^2$ with almost free from leakage current. The maximum efficacy was 4.1 cd/A.

Example 2

Production of an Organic EL Device

An organic EL device was produced using a substrate with a conductive thin film containing wire-like conductors and a light curable resin pattern-formed thereon (product of Cambrios Technologies Corporation). The wire-like conductor was partially exposed from the light curable resin and the first electrode had a surface roughness Ra of 12.2 nm. The substrate was treated with UV ozone for 5 minutes. Further, a solution, wherein a poly(3,4-ethylenedioxythiophen)/polystyrene sulfonate (tradename: AI4083, product of H. C. Starck-V TECH Ltd.) suspension was neutralized with ammonia water, was applied, as a coating solution containing the conductive resin, to the above substrate by the spin coating method. The coating solution applied to the unnecessary region was removed, and the coating solution was further heat-treated on a hot plate at 200° C. for 15 minutes under an atmosphere to form a conductive resin layer having a thickness of 170 nm, thereby obtaining an electrode coated transparent substrate. The wire-like conductors were made not exposed to the surface by forming the conductive resin layer. The first electrode had a surface roughness Ra of 5.8 nm.

Next, a xylene solution containing F8-TFB (a copolymer of 9,9-dioctylfluorene and N-(4-butylphenyl) diphenylamine) in a concentration of 0.7 mass % was prepared. The solution was applied to the above first electrode by the spin coating method. The part of the film formed on the unnecessary region was removed, and the film was further heat-treated on a hot plate at 180° C. for 20 minutes under a nitrogen atmosphere, thereby forming a hole transport layer having a thickness of 15 nm.

Then, a xylene solution containing Lumation WP 1540 (product by SUMATION), a white light-emitting material, in a concentration of 1.2 mass % was prepared. The solution was applied to the above hole transport layer by the spin coating method. The part of the film formed on the unnecessary region was removed, and the film was further heat-treated on a hot plate at 130° C. for 60 minutes under a nitrogen atmosphere, thereby forming a light-emitting layer having a thickness of 65 nm.

The substrate with the light-emitting layer formed thereon was introduced into a vacuum deposition device, and Ba and Al were successively vapor deposited to a thickness of 5 nm and 100 nm, respectively, to form the cathode. The metal vapor deposition was started after the degree of vacuum reached $2.5 \times 10^{-4}$ Pa or lower.

Next, a light curable sealant was applied around a sealing glass using a dispenser, the substrate on which the organic EL device was formed and the sealing glass were attached under a nitrogen atmosphere, further followed by curing the light curable sealant using ultraviolet rays to complete the sealing, thereby producing an organic EL device.

EL Property Evaluation

The produced device was energized for the voltage-current property evaluation. The current density at an applied voltage of 5V was 0.011 mA/cm$^2$ with almost free from leakage current. The maximum efficacy was 3.3 cd/A.

Comparative Example 1

An organic EL device was produced using a substrate with a conductive thin film containing wire-like conductors and a light curable resin pattern formed thereon (product of Cambrios Technologies Corporation) as in Example 2. The substrate was treated with UV ozone for 5 minutes. Further, a solution, wherein a poly(3,4-ethylenedioxythiophen)/polystyrene sulfonate (tradename: AI4083, product of H. C. Starck-V TECH Ltd.) suspension was neutralized with ammonia water, was applied, as a coating solution containing the conductive resin, to the above substrate by the spin coating method. The coating solution applied on the unnecessary region was removed, and the coating solution was further heat-treated on a hot plate at 200° C. for 15 minutes under an atmosphere to form a conductive resin layer having a thickness of 100 nm, thereby obtaining the first electrode. The wire-like conductors were partially exposed from the surface of the first electrode, which had a surface roughness Ra of 11.7 nm.

Next, a xylene solution containing F8-TFB (a copolymer of 9,9-dioctylfluorene and N-(4-butylphenyl)diphenylamine) in a concentration of 0.7 mass % was prepared. The solution was applied to the above first electrode by the spin coating method. The part of the film formed on the unnecessary region was removed, and the film was further heat-treated on a hot plate at 180° C. for 20 minutes under a nitrogen atmosphere, thereby forming a hole transport layer having a thickness of 15 nm.

Then, a xylene solution containing Lumation WP 1540 (product by SUMATION), a white light-emitting material, in a concentration of 1.2 mass % was prepared. The solution was applied to the hole transport layer by the spin coating method. The part of the film formed on the unnecessary region was removed, and the film was heat-treated on a hot plate at 130° C. for 60 minutes under a nitrogen atmosphere, thereby forming a light-emitting layer having a thickness of 65 nm.

The substrate with the light-emitting layer formed thereon was introduced into a vacuum deposition device, and Ba and Al were successively vapor deposited to a thickness of 5 rim and 100 nm, respectively, to form the cathode. The metal vapor deposition was started after the degree of vacuum reached $2.5 \times 10^{-4}$ Pa or lower.

Next, a light curable sealant was applied around a sealing glass using a dispenser, the substrate on which the organic EL device was formed and the sealing glass were attached under a nitrogen atmosphere, further followed by curing the light curable sealant using ultraviolet rays to complete the sealing, thereby producing an organic EL device.

EL Property Evaluation

The produced device was energized for the voltage-current property evaluation. The current density at an applied voltage of 5V was 4.74 mA/cm$^2$ with excessive leakage current. The maximum efficacy was 2.2 cd/A.

As described above, in Example 2 compared to Comparative Example 1, the organic EL device for which a leakage current is reduced, hence having a higher efficacy is produced as a result by forming the thick conductive resin layer and providing the conductive resin layer with no conductive wires in addition to the mixture layer containing the conductive wires and the conductive resin.

INDUSTRIAL APPLICABILITY

The present invention is applicable to provide an organic electroluminescence device with suppressed occurrence of the leakage current having a high luminous efficacy.

REFERENCE SIGNS LIST

1 Electrode-coated transparent substrate
2 Transparent plate
3 First electrode
4 Mixture layer
5 Organic EL device
6 Conductive resin layer
7 Organic layer
8 Second electrode
10 Wire-like conductor

The invention claimed is:

1. An organic electroluminescence device comprising
an electrode-coated transparent substrate comprising a light-transmissive transparent plate and a light-transmissive first electrode provided thereon,
a second electrode positioned as opposed to the first electrode and having a polarity different from the first electrode, and
a light-emitting layer provided between the first electrode and the second electrode, wherein
the first electrode comprises
a mixture layer containing a conductive first resin and a large number of wire-like conductors, and
a conductive resin layer containing a conductive resin and no wire-like conductors, and
the first electrode comprises the mixture layer positioned on the side of the transparent plate and laminated on the transparent plate.

2. The organic electroluminescence device according to claim 1, wherein the first resin contained in the mixture layer is a resin having the same composition as the conductive resin contained in the conductive resin layer.

3. The organic electroluminescence device according to claim 2, wherein the first resin contained in the mixture layer and the resin contained in the conductive resin layer are integrally formed.

4. The organic electroluminescence device according to claim 1, wherein the mixture layer further contains at a position contacting the transparent plate a second resin having a higher adhesion to the transparent plate than the first resin.

5. The organic electroluminescence device according to claim 1, wherein the first electrode has a surface roughness of 10 nm or less.

6. The organic electroluminescence device according to claim 1, wherein the large number of wire-like conductors in the mixture layer form a network structure.

7. The organic electroluminescence device according to claim 1, wherein the wire-like conductor has a diameter of 200 nm or less.

8. The organic electroluminescence device according to claim 1, wherein, with n1 being a refractive index of the first electrode and n2 being a refractive index of the transparent plate, n1 and n2 meet the following formulae:

$|n2-n1|<0.3$ $n1 \leq 1.8,$ respectively.

9. The organic electroluminescence device according to claim 1, wherein the first electrode is an anode.

10. A lighting device which uses the organic electroluminescence device according to claim 1.

11. A process for producing an organic electroluminescence device comprising the steps of
preparing a transparent plate,
forming a conductive wire layer by coating the transparent plate with a dispersion containing a large number of wire-like conductors dispersed in a dispersion medium and further removing the dispersion medium,
forming a mixture layer comprising the large number of wire-like conductors and a conductive resin mixed together and a conductive resin layer integrally formed on the mixture layer, by coating the conductive wire layer with a coating solution containing the conductive resin and drying the coating solution,
forming a light-emitting layer on the conductive resin layer, and
forming an electrode on the light-emitting layer.

12. The process for producing an organic electroluminescence device according to claim 11, further comprising, after the step of forming a conductive wire layer and before coating the conductive wire layer with the coating solution containing the conductive resin, a step of forming a resin layer having a lower height from the transparent plate than the conductive wire layer by coating the conductive wire layer with a coating solution containing a second resin having a higher adhesion to the transparent plate than the conductive resin and further drying the coating solution.

13. The process for producing an organic electroluminescence device according to claim 11, wherein the conductive wire layer is pattern formed in the step of forming a conductive wire layer.

* * * * *